(12) United States Patent
Odegard et al.

(10) Patent No.: US 7,550,314 B2
(45) Date of Patent: Jun. 23, 2009

(54) PATTERNED PLASMA TREATMENT TO IMPROVE DISTRIBUTION OF UNDERFILL MATERIAL

(75) Inventors: Charles Anthony Odegard, McKinney, TX (US); Mohammad Yunus, Dallas, TX (US); Ferdinand Borromeo Arabe, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 183 days.

(21) Appl. No.: 11/374,496

(22) Filed: Mar. 13, 2006

(65) Prior Publication Data

US 2006/0148136 A1 Jul. 6, 2006

Related U.S. Application Data

(62) Division of application No. 10/732,567, filed on Dec. 10, 2003, now Pat. No. 7,045,904.

(51) Int. Cl.
*H01L 21/00* (2006.01)
(52) U.S. Cl. ...................... 438/106; 438/108
(58) Field of Classification Search ............... 438/106, 438/108
See application file for complete search history.

(56) References Cited

U.S. PATENT DOCUMENTS

| 5,115,456 | A * | 5/1992 | Kimura et al. | 378/35 |
|---|---|---|---|---|
| 6,306,683 | B1 * | 10/2001 | Dery et al. | 438/108 |
| 6,506,633 | B1 * | 1/2003 | Cheng et al. | 438/126 |
| 6,614,122 | B1 * | 9/2003 | Dory et al. | 257/787 |
| 6,926,190 | B2 * | 8/2005 | Jiang et al. | 228/180.22 |
| 2002/0014703 | A1 * | 2/2002 | Capote et al. | 257/778 |
| 2003/0180807 | A1 * | 9/2003 | Hess et al. | 435/7.1 |
| 2003/0203535 | A1 * | 10/2003 | Kodnani et al. | 438/106 |
| 2004/0121512 | A1 * | 6/2004 | Manepalli et al. | 438/106 |
| 2005/0121310 | A1 * | 6/2005 | Yamada et al. | 204/192.12 |

\* cited by examiner

*Primary Examiner*—David E Graybill
(74) *Attorney, Agent, or Firm*—Yingsheng Tung; Wade J. Brady, III; Frederick J. Telecky, Jr.

(57) ABSTRACT

A patterned plasma treatment may be provided on the chip and/or the substrate to enhance the distribution of underfill material between the chip and the substrate. The underfill material is typically dispensed after the chip is electrically connected to the substrate. The chip may be electrically connected to the substrate by an array of solder bumps, as one example. The underfill material is draw into a gap between the chip and the substrate by a capillary action. The patterned plasma-treated area formed on the chip and/or on the substrate may cause greater capillary force on the underfill material, as compared to non-plasma-treated areas. Such patterned plasma-treatment area may be designed and laid out to provide for more or better control of the underfill distribution between the chip and substrate while forming a chip package.

4 Claims, 5 Drawing Sheets

PATTERNED PLASMA TREATMENT TO IMPROVE DISTRIBUTION OF UNDERFILL MATERIAL

This is a divisional application of application Ser. No. 10/732,567 filed Dec. 10, 2003 now U.S. Pat. No. 7,045,904, the contents of which are herein incorporated by reference in its entirety.

TECHNICAL FIELD

The present invention generally relates to providing an underfill layer between a chip and a substrate, such as the case where the chip is electrically connected to the substrate by an array of solder bumps located between the chip and the substrate. In one aspect, it relates to a patterned plasma treatment to improve the distribution of the underfill material.

BACKGROUND

Integrated circuit devices typically include a semiconductor die or chip that is assembled in a package. A package typically has a substrate portion that the chip is electrically connected to. Usually the substrate is larger than the chip and has a larger array of leads or electrical contact points than that of the chip to allow for ease of assembly of the packaged chip onto a circuit board. One such package configuration is a flip-chip package.

An example of a conventional flip-chip package 20 is shown in FIG. 1. In this example, the chip 22 is electrically connected to the substrate 24 by an array of solder bumps 26. The substrate 24 in this example has an array of solder balls 28 (i.e., ball grid array or BGA), which may be used to attach the packaged chip 20 to a circuit board (not shown), for example. Typically, an underfill material 30 is fed into the free space or gap between the chip 22 and the substrate 24 after the chip 22 is electrically connected to the substrate 24 via the solder bumps 26. Because the distance between the chip 22 and the substrate 24 is often very small (e.g., between about 30 μm and about 50 μm), the underfill material 30 may be fed into the gap between the chip 22 and the substrate 24 by capillary action. After the underfill material 30 is placed between the chip 22 and the substrate 24, as shown in FIG. 1, the underfill material 30 is often cured. Such curing may include heating the package 20 up to a temperature of about 150° C., for example.

At some point after the chip 22 is electrically connected to the substrate 24 and the underfill material 30 is placed and cured, a lid 32 is typically placed over the chip 22. The lid 32 is shown in phantom lines in FIG. 1 for purposes of illustration. In addition to protecting the chip 22 in the package 20, this lid 32 may be made from aluminum and act as a heat sink to provide better cooling for the chip 22, for example.

One of the purposes of the underfill material 30 is to more evenly distribute the stresses between the chip 22 and the substrate 24 to reduce the stresses experienced by the solder bumps 26, solder bump joints, and/or circuitry layers above/below solder joints. Such stresses are caused, at least in part, by different coefficients of thermal expansion between the chip 22, the solder bumps 26, and the substrate 24 (i.e., coefficient of thermal expansion mismatch). The chip 22 is typically made from a silicon wafer, the substrate 24 is typically made from organic material having copper lines and vias extending therein, and the solder bumps 26 are typically made from a metal compound having a low melting point, for example. Thus, temperature changes (e.g., during use of the chip 22) cause stress on the solder bumps 26 connecting the chip 22 to the substrate 24 due to the different rates of material expansion/contraction between the chip 22 and the substrate 24 as the temperature changes. The underfill material 30 may also act as an adhesive to help retain the chip 22 to the substrate 24 so that not just the solder bumps 26 are holding the chip 22 in place. This further reduces stress exerted on the solder bumps 26.

When the underfill material 30 is cured, it is preferable that there are no voids or air pockets remaining between the chip 22 and the substrate 24 and/or within the underfill material 30. Such voids create points of stress concentration and may act as crack initiation sites. Once a crack initiates, it will often grow and propagate through the underfill material 30 until the stress is relieved. A crack may propagate into the chip itself and/or through a solder bump or some other line in the chip or substrate. This may cause a failure site or an open connection, either of which is highly undesirable and may cause the chip to function improperly or fail to function at all. Also, if a void happens to be located between two solder bumps, the material from those solder bumps may eventually extrude into the void causing a short between those bumps. This is also highly undesirable. Thus, one of the main goals in dispensing an underfill material 30 is to avoid the formation of voids or air pockets therein.

FIG. 2 shows a top view (chip side) of the substrate 24 without the chip 22 electrically connected thereto. In FIG. 2, the contacts 34 where the solder bumps will connect the chip to the substrate are shown to illustrate an example contact pattern. There are many possible variations for contact patterns. The contact pattern on the substrate 24 is typically the mirror image of the contact pattern on the chip 22. The solder bumps 26 may be formed on the substrate contacts 34 and/or the chip contacts. Hence, the pattern of the solder bumps 26 is usually the same as the contact pattern on the substrate 24 and/or the contact pattern on the chip 22.

FIG. 3 shows the substrate 24 of FIG. 2 with a chip 22 electrically connected thereto via solder bumps 26. The solder bumps 26 are shown with dashed lines in FIG. 3, as they are located between the chip 22 and the substrate 24 (see e.g., FIG. 1).

FIG. 4 illustrates the flow of underfill material 30 as it is drawn between the chip 22 and the substrate 24 of FIG. 3. In a conventional process, the underfill material 30 is typically dispensed at one end of the chip 22 and capillary action draws the underfill material 30 into the gap between the chip 22 and the substrate 24. Generally, the underfill material 30 is distributed faster or the capillary force is stronger in areas where the solder bumps 26 are located because the solder bumps 26 provide more surface area for the fluid (i.e., the underfill material 30) to grab onto. Hence, as illustrated in FIG. 4, the areas with higher densities of solder bumps 26 may be filled with underfill material 30 faster than other areas having lower solder bump density.

In FIG. 4, numerous phantom-lined outlines are shown to illustrate the progression of the underfill material 30 as it is drawn into the gap. A first phantom-lined outline 36 in FIG. 4 illustrates the area where the underfill material is initially dispensed. Note that by the fourth phantom-lined outline 38, the distribution of the underfill material is beginning to be uneven, as the underfill material is distributed faster at the outer edges where the solder bumps are located. By the sixth phantom-lined outline 40, the distribution of the underfill material is even more uneven. At the tenth phantom-lined outline 42, the underfill material has reached the other end of the chip 22 on the outer edges where the solder bumps 26 are more densely distributed. At the eleventh phantom-lined outline 44, the underfill material is beginning to be distributed along the end of the chip 22. Meanwhile at the central region of the chip 22, the underfill material is being distributed slower and has not reached the end rows of solder bumps 26. At the twelfth phantom-lined outline 46, the underfill material coming from the outer edges has met near the middle and formed an air pocket or air bubble 50, which remains trapped between the chip 22 and the substrate 24 within the underfill material 30. As discussed above, such air pockets or voids are highly undesirable. Hence, there is a need for a way to ensure that the underfill material gets distributed more evenly and preferably without voids or air pockets.

SUMMARY OF THE INVENTION

The problems and needs outlined above may be addressed by embodiments of the present invention. A patterned plasma treatment may be provided on the chip and/or the substrate to enhance the distribution of underfill material between the chip and the substrate. The underfill material is typically dispensed after the chip is electrically connected to the substrate. The chip may be electrically connected to the substrate by an array of solder bumps, as one example. The underfill material is draw into a gap between the chip and the substrate by a capillary action. The patterned plasma-treated area formed on the chip and/or on the substrate may cause greater capillary force on the underfill material, as compared to non-plasma-treated areas. Such patterned plasma-treatment area may be designed and laid out to provide for more or better control of the underfill distribution between the chip and substrate while forming a chip package.

In accordance with one aspect of the present invention, a packaged chip is provided. The packaged chip includes a substrate, a chip, and an underfill material. The chip is electrically connected to the substrate. A first side of the chip faces the substrate. The first chip side has a first patterned plasma-treated area. The first patterned plasma-treated area on the chip is smaller than the first chip side. The underfill material is disposed between the chip and the substrate.

A first side of the substrate may face the chip and the first substrate side may have a second patterned plasma-treated area. The second patterned plasma-treated area on the substrate may be in but not entirely covering a chip area where the chip resides over the substrate. A shape of the first patterned plasma-treated area on the chip may substantially match a shape of the second patterned plasma-treated area on the substrate. Alternatively, a shape of the first patterned plasma-treated area on the chip may differ from a shape of the second patterned plasma-treated area on the substrate. The first patterned plasma-treated area on the chip may have a shape that is triangular, trapezoidal, rectangular, oval, rounded-corner polygonal, or polygonal, for example. The first chip side may have an additional plasma treated area on the chip at least partially outside of the first patterned plasma-treated area. The additional plasma treated area may have a different surface texture than that of the first patterned plasma-treated area. The chip may be electrically connected to the substrate by an array of solder bumps.

In accordance with another aspect of the present invention, a packaged chip is provided. The packaged chip includes a chip, a substrate, and an underfill material. The substrate is electrically connected to the chip. A first side of the substrate faces the chip. The first substrate side has a patterned plasma-treated area and the patterned plasma-treated area on the substrate is in but not entirely covering a chip area where the chip resides over the substrate. The underfill material is disposed between the chip and the substrate.

A first side of the chip may face the substrate and the first chip side may have a second patterned plasma-treated area, the second patterned plasma-treated area on the chip may be smaller than the first chip side. The first patterned plasma-treated area on the chip may have a shape that is triangular, trapezoidal, rectangular, oval, rounded-corner polygonal, or polygonal, for example. The first chip side may have an additional plasma treated area on the chip at least partially outside of the first patterned plasma-treated area. The additional plasma treated area may have a different surface texture than that of the first patterned plasma-treated area.

In accordance with still another aspect of the present invention, a method of providing an underfill material between a chip and a substrate, is provided. This method includes the following steps, the order of which may vary. A chip mask is provided having a pattern formed therein. The chip mask is placed over the chip. A plasma treatment is performed through the pattern formed in the chip mask onto a first side of the chip to form a plasma treated area on the first side of the chip. The plasma treated area on the chip has a shape corresponding to the chip mask pattern. The plasma treated area is smaller than the first side of the chip. The chip is electrically connected to the substrate. A gap remains between the chip and the substrate. The first side of the chip faces the substrate. The underfill material is dispensed on the substrate at a location where the underfill material will be drawn into the gap by a capillary action.

The method may further include: providing a substrate mask having a pattern formed therein; placing the substrate mask over the substrate; and performing a plasma treatment through the pattern formed in the substrate mask onto a first side of the substrate to form a plasma treated area on the first side of the substrate. The plasma treated area on the substrate may have a shape corresponding to the substrate mask pattern and the plasma treated area on the substrate may be in but not entirely covering a chip area where the chip resides over the substrate when the chip may be electrically connected to the substrate.

In accordance with yet another aspect of the present invention, a method of providing an underfill material between a chip and a substrate, is provided. This method includes the following steps, the order of which may vary. A substrate mask is provided having a pattern formed therein. The substrate mask is placed over the substrate. A plasma treatment is performed through the pattern formed in the substrate mask onto a first side of the substrate to form a plasma treated area on the first side of the substrate. The plasma treated area on the substrate has a shape corresponding to the substrate mask pattern. The plasma treated area on the substrate is in but not entirely covering a chip area where the chip will reside over the substrate when the chip is electrically connected to the substrate. The chip is electrically connected to the substrate. A gap remains between the chip and the substrate. The first side of the substrate faces the chip. The underfill material is dispensed on the substrate at a location where the underfill material will be drawn into the gap by a capillary action.

The method may further include: providing a chip mask having a pattern formed therein; placing the chip mask over the chip; performing a plasma treatment through the pattern formed in the chip mask onto a first side of the chip to form a plasma treated area on the first side of the chip. The plasma treated area on the chip may have a shape corresponding to the chip mask pattern and the plasma treated area may be smaller than the first side of the chip.

In accordance with yet another aspect of the present invention, a method of plasma treating a chip and/or a substrate to enhance underfill material distribution between the chip and the substrate when the chip is electrically connected to the substrate, is provided. This method includes the following steps, the order of which may vary. If the chip is to be provided with a patterned chip plasma treatment, a chip mask is provided having a pattern formed therein, the chip mask is placed over the chip, and a chip plasma treatment is performed on the chip through the pattern formed in the chip mask, such that a plasma treated area having a shape corresponding to the chip mask pattern is formed on the chip. In such case, the plasma treated area on the chip is smaller than the chip. If the substrate is to be provided with a patterned substrate plasma treatment, a substrate mask is provided having a pattern formed therein, the substrate mask is placed over the substrate, and a substrate plasma treatment is performed on the substrate through the pattern formed in the substrate mask, such that a plasma treated area having a shape corresponding to the substrate mask pattern is formed on the substrate. In such case, the plasma treated area on the substrate is in but not entirely covering a chip area where the chip will reside over the substrate when the chip is electrically connected to the substrate.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
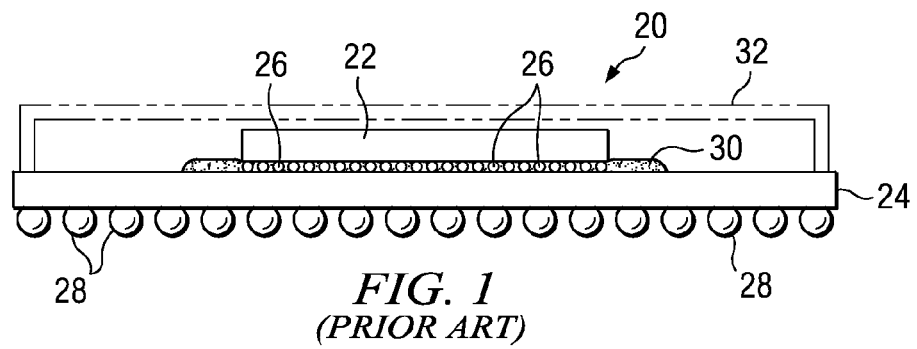
FIG. 1 is side view of a flip-chip package of the prior art.

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Plasma treating a surface of the chip 22 and/or the substrate 24 may increase or enhance the flow rate of underfill material 30 between the chip 22 and the substrate 24. Also, such plasma treatment may improve adhesion of the underfill material 30 with the chip 22 and/or substrate 24. The plasma treatment may achieve these benefits in a number of ways. The plasma treatment may roughen the surface by forming pits in the surface, for example. The roughening of the surface may increase the surface area where the underfill material 30 wets the surface, which may in turn enhance the capillary action. Also, the roughening may provide better adhesion by providing a mechanical interlocking between the cured underfill material and the surface within the pits. This may increase the level of shear stress that the adhesion bond (between the underfill material and the chip/substrate surface) can withstand.

The plasma treatment may also provide a cleaning effect. If there is a residue material (e.g., organic material) or contaminant on the surface of the chip/substrate, the plasma treatment may remove part or all of such contaminants. Such unwanted residue material or contaminants may reduce the adhesion between the underfill material and the chip/substrate surface because the underfill material may be bonding to the contaminants, which themselves are typically not well adhered to the surface. Yet another advantage of plasma treatment that may be realized is that the plasma treatment may activate the surface. Such activation may enhance bonding by charging particles on the surface or providing additional sites where bonding can occur, for example. However, taking advantage of such activation may be short lived. For example, the surface may remain activated for only about three hours in some cases. Thus, any one or any combination of these advantages provided by a plasma treatment (i.e., roughening, cleaning, and activation) may be realized, depending at least in part on the materials used and the plasma treatment parameters.

The plasma treatment parameters may vary widely, depending in large part upon the material(s) present on the surface of the chip 22 or the substrate 24. Some of the relevant plasma treatment parameters that may be adjusted include (but are not necessarily limited to): plasma gas, gas flow rate, plasma power, chamber pressure, and plasma treatment time, for example. The plasma gas may include argon, oxygen, or mixtures of argon and oxygen (entire spectrum of ratios), for example. The plasma power may be between about 100 and about 600 watts, for example. The plasma treatment time may be between about 15 and about 600 seconds, for example. The gas flow rate may be between about 5 and about 400 sccm, for example. In a preferred embodiment, the plasma treatment may be performed for about 420 seconds with an argon gas flowing at about 200 sccm under a power of about 250 watts, for example. With the benefit of this disclosure, one of ordinary skill in the art will realize many other plasma treatment parameters for providing the desired results.

Figure 5:
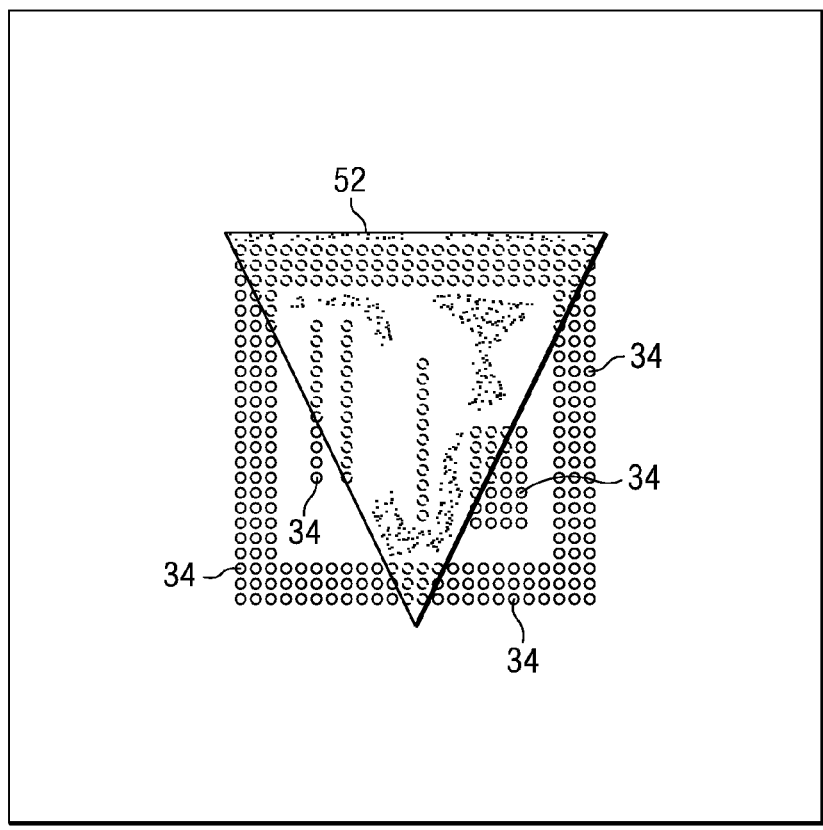
FIG. 5 shows a chip side of a substrate of a first embodiment of the present invention.

FIG. 5 shows a substrate 24 that has had a patterned plasma treatment performed on it in accordance with a first embodiment of the present invention. In FIG. 5, a triangle-shaped area 52 on the substrate 24 has been subjected to a plasma treatment to enhance the flow of the underfill material 30 within this area. To form the patterned plasma-treated area 52, a mask (not shown) having a triangle-shaped hole form therein may be placed over the substrate 24 while the substrate 24 is subjected to a plasma treatment. Any suitable mask or masking technique may be used to provide the pattern for the plasma treatment. Such suitable mask or masking techniques should be apparent to one of ordinary skill in the art.

Figure 2:
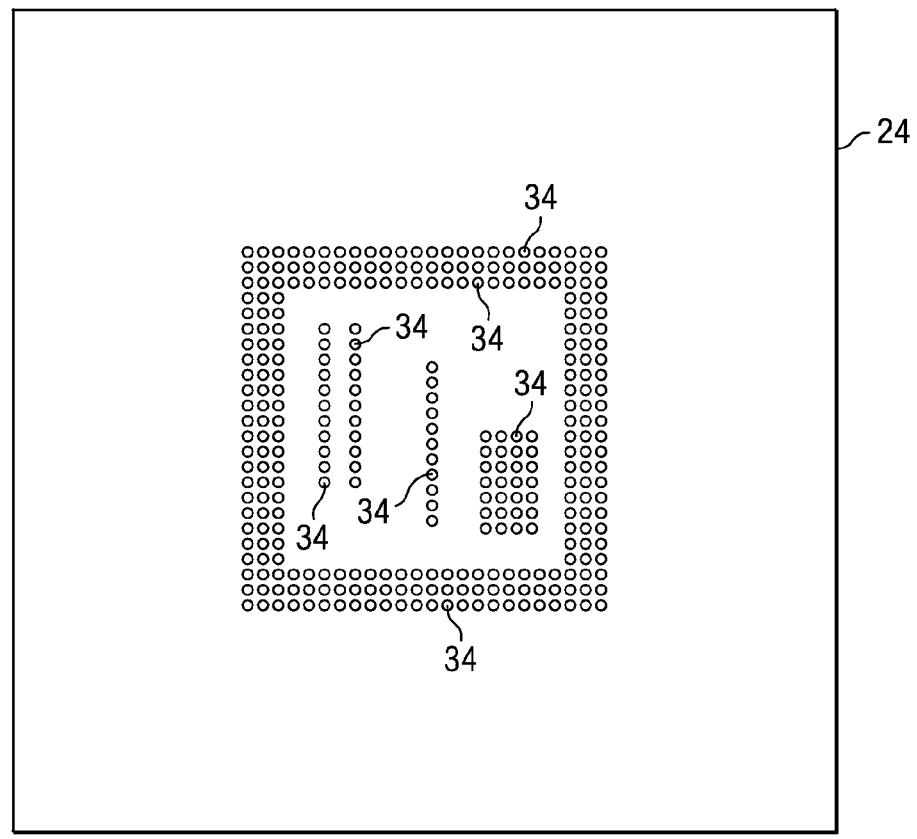
FIG. 2 shows a chip side of a substrate of the prior art.
Figure 3:
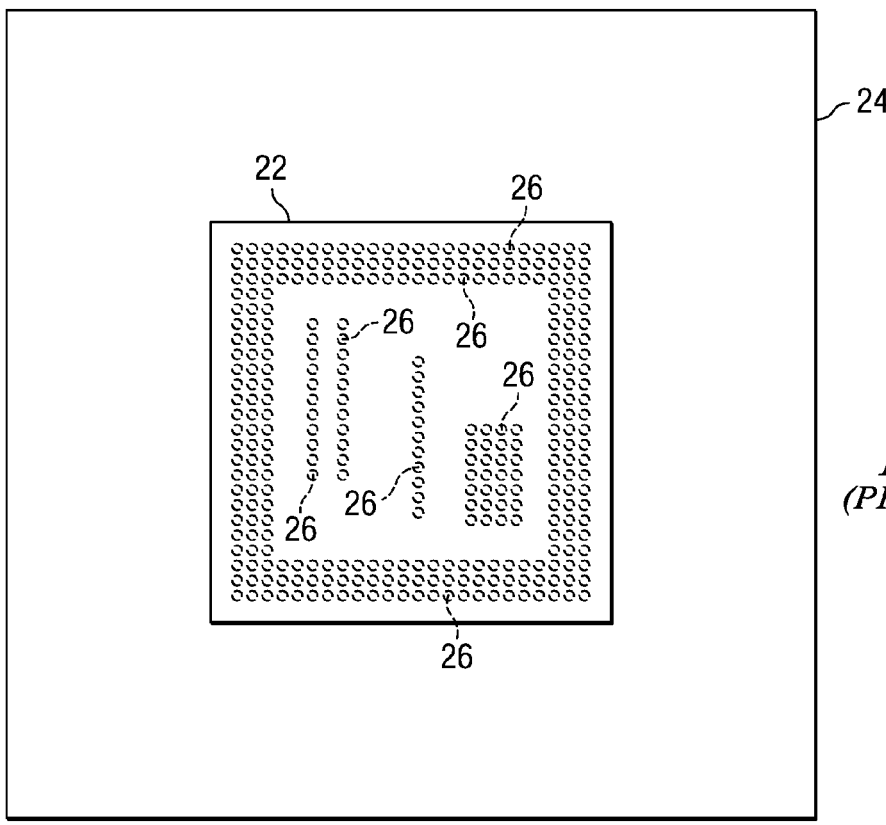
FIG. 3 shows the substrate of FIG. 2 with a chip electrically connected thereto.
Figure 4:
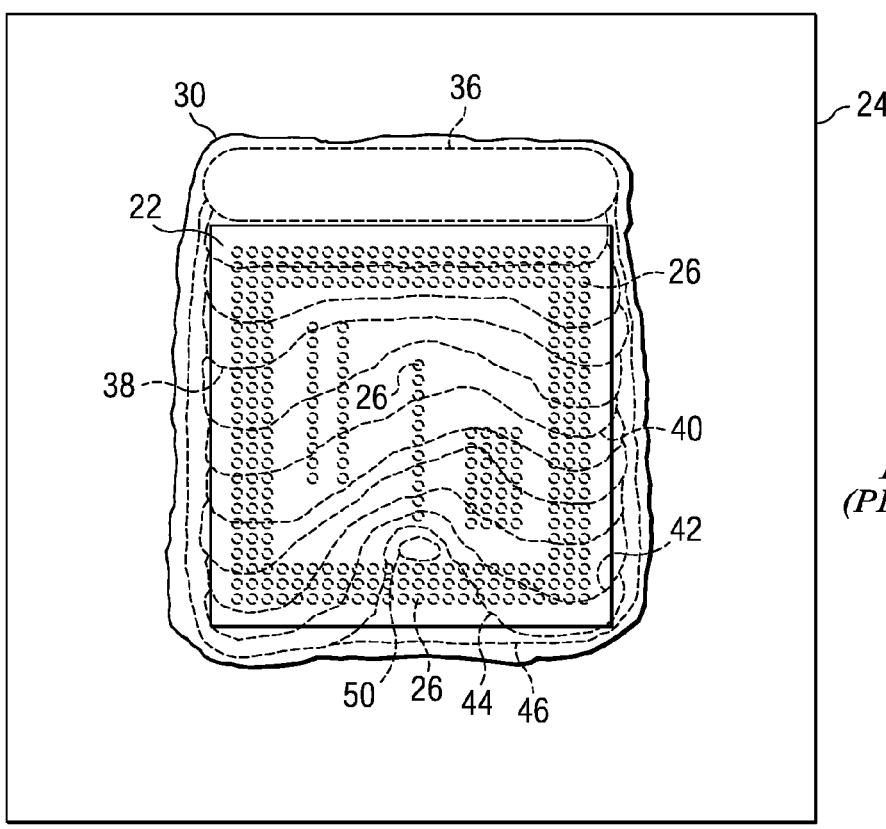
FIG. 4 illustrates the chip and substrate of FIG. 3 as underfill material is drawn into a gap between the chip and substrate by a capillary action.
Figure 6:
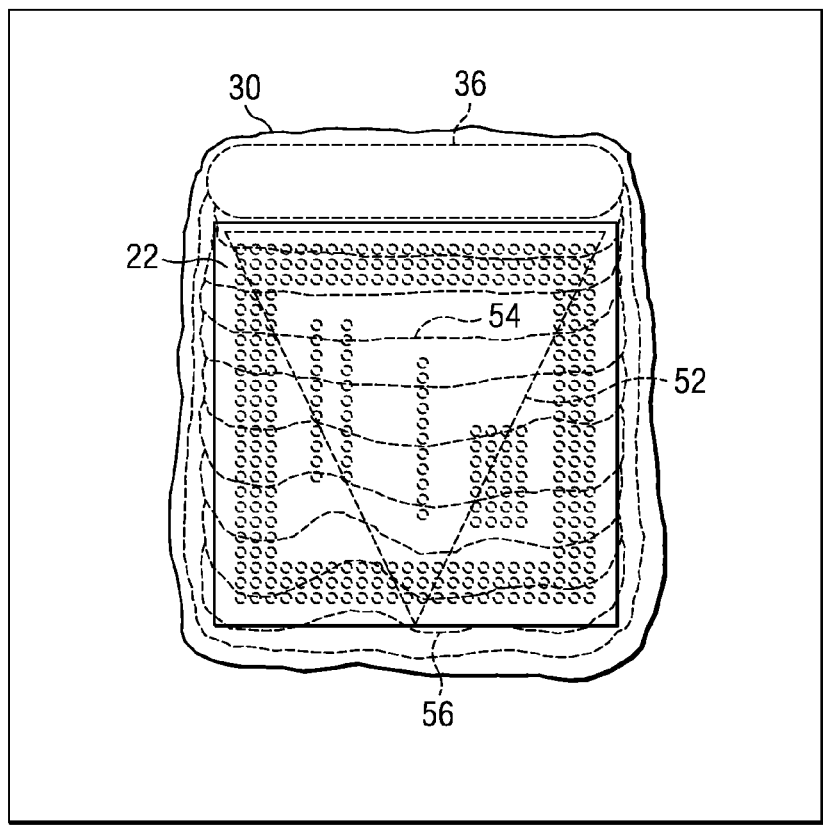
FIG. 6 shows the substrate of FIG. 5 with a chip electrically connected thereto as an underfill material is disposed between the chip and substrate.

In FIG. 6, a chip 22 has been electrically connected to the substrate 24 via solder bumps 26. FIG. 6 illustrates the flow of underfill material 30 as it is drawn between the chip 22 and the substrate 24 of FIG. 5. Note that the substrate 24 of FIG. 5 has the same contact/solder bump pattern as the substrate 24 shown in FIGS. 2 and 3. Hence, FIG. 6 is comparable to FIG. 4.

In FIG. 6, numerous phantom-lined outlines are shown to illustrate the progression of the underfill material 30 as it is drawn into the gap between the chip 22 and the substrate 24. A first phantom-lined outline 36 in FIG. 6 illustrates the area where the underfill material is initially dispensed, which is the same as in FIG. 4 for purposes of comparison. The underfill material may be dispensed in other locations and in other patterns. Note that at the fourth phantom-lined outline 54, the distribution of the underfill material remains evenly distributed across the chip 22, as compared to the fourth phantom-lined outline 38 in FIG. 4. The underfill material may flow faster at the plasma treated area 52 than the non-plasma treated areas, depending on the solder bump density in the non-plasma treated areas. In FIG. 6 at the tenth phantom-lined outline 60, the underfill material has reached the other end of the chip 22 without leaving an air pocket trapped between the chip 22 and the substrate 24. The resulting outline 62 of the underfill material 30 is shown in FIG. 6. An object of the first embodiment is to enhance the distribution of the underfill material down the middle of the chip to prevent or reduce the likelihood that an air pocket or void is formed (e.g., see void at middle region of chip in FIG. 4). The preferred result is that the underfill material 30 will completely fill the gap between the chip 22 and the substrate 24 without voids and air pockets, as shown in FIG. 6.

One or more substrates 24 may be plasma treated at a time. It may be preferable to perform the plasma treatment on a tray full of many substrates at one time. In such case, a single mask having multiple patterns formed therein (e.g., a pattern for each substrate in the tray) may be used, or multiple masks may be used, for example. In a preferred embodiment, a mask having multiple patterns formed therein is adapted to fit over a tray full of substrates 24 so that the patterns of the mask will be aligned with the substrates. Such tray may be maximized to fit the greatest number of substrates into the plasma chamber at one time, for example.

Figure 7:
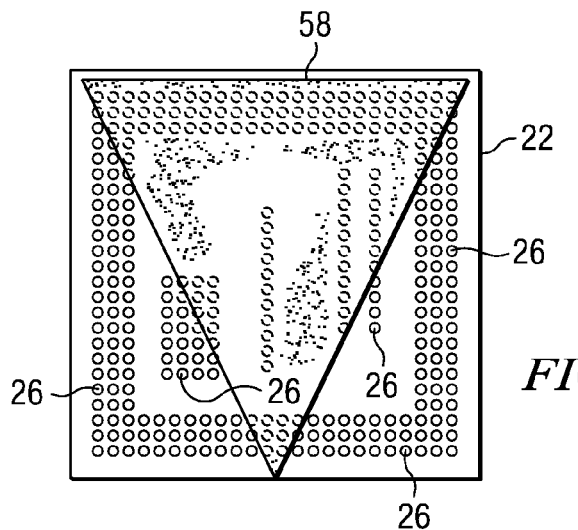
FIG. 7 shows a substrate side of a chip of a second embodiment of the present invention.

The patterned plasma treatment may be performed on the substrate 24 and/or on the chip 22 to form a variety of other embodiments of the present invention. FIG. 7 shows a chip 22 adapted for being electrically coupled to the substrate 24 of FIG. 5 via an array of solder bumps 26, for example. In accordance with a second embodiment of the present invention, the chip 22 of FIG. 7 has been patterned plasma-treated area 58 with a pattern matching that of the patterned plasma-treated area 52 provided on the substrate 24. Thus in the second embodiment, both the chip 22 and the substrate 24 have a patterned plasma-treated area (52 and 58).

In other embodiments, however, the patterned plasma-treated area 58 on the chip 22 may not match or may differ from the patterned plasma-treated area 52 on the substrate 24. Furthermore, only the chip 22 or only the substrate 24 may have a patterned plasma-treated area (52 or 58) formed thereon.

Figure 8:
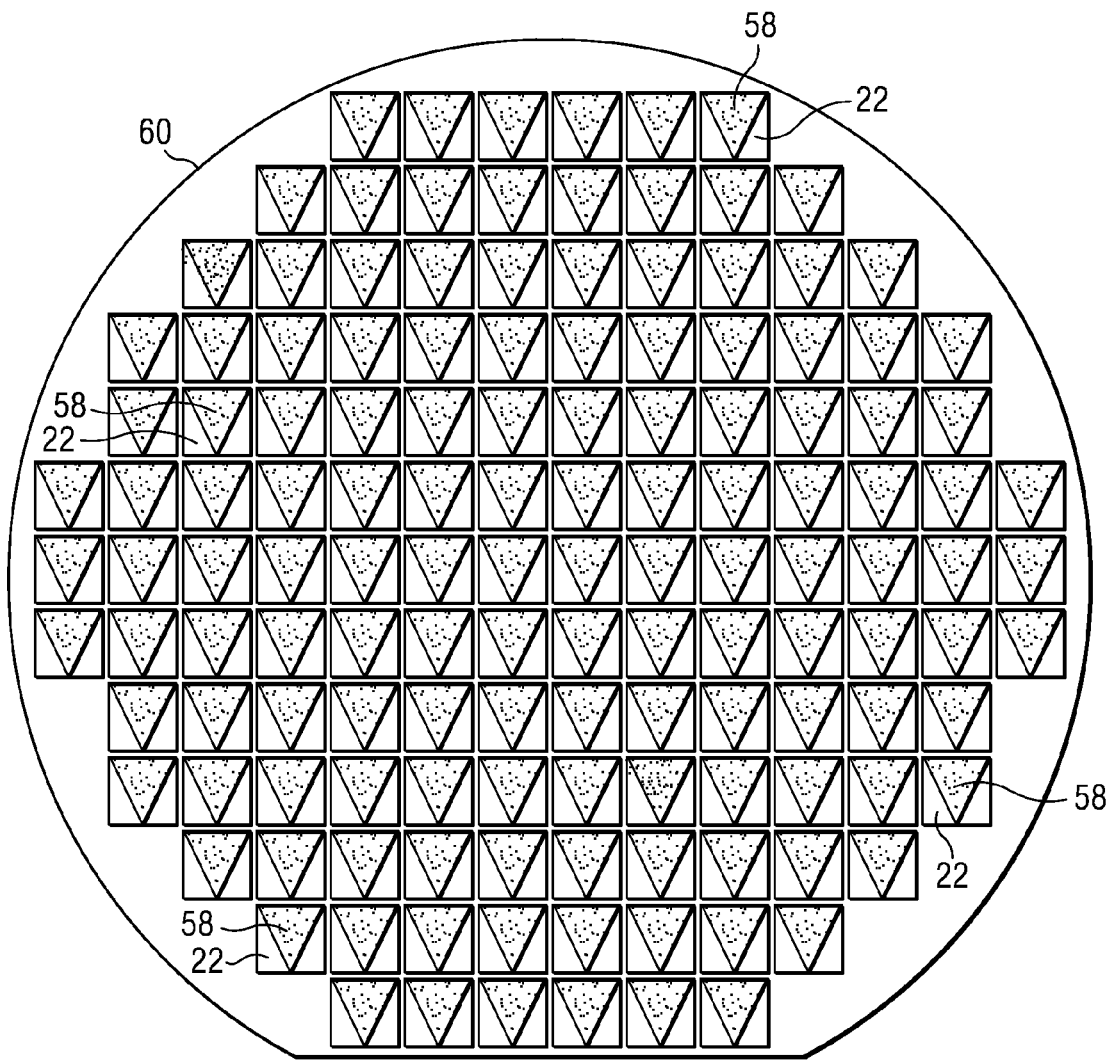
FIG. 8 shows a wafer that includes a plurality of chips having patterned plasma-treated areas thereon in accordance with the second embodiment of the present invention.

When a chip 22 is plasma treated in a pattern, as shown in FIG. 7, one or more chips 22 may be subjected to the plasma treatment at a time. Preferably, a whole wafer 60 of chips 22 is plasma treated together (i.e., before the chips 22 are cut from the wafer 60), as shown in FIG. 8, for example. In such case, a single mask (not shown) having multiple patterns formed therein may be placed over the wafer 60 so that the patterns are in alignment with the chips 22. In alternative, multiple masks may be used to cover the wafer 60 during the plasma treatment.

Figure 9:
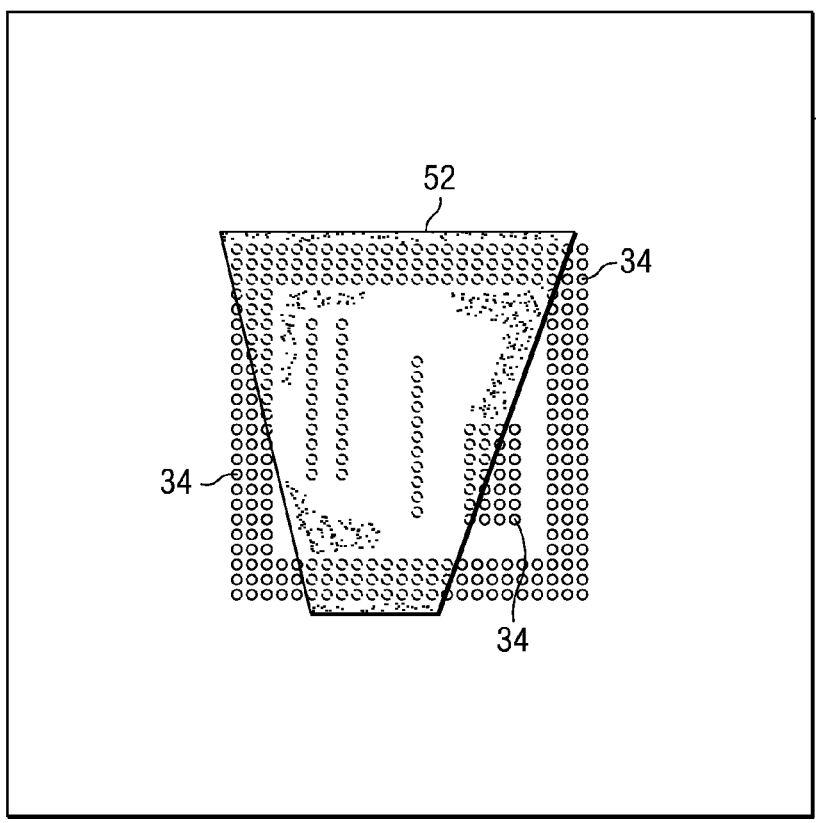
FIG. 9 shows a substrate of a third embodiment of the present invention.
Figure 10:
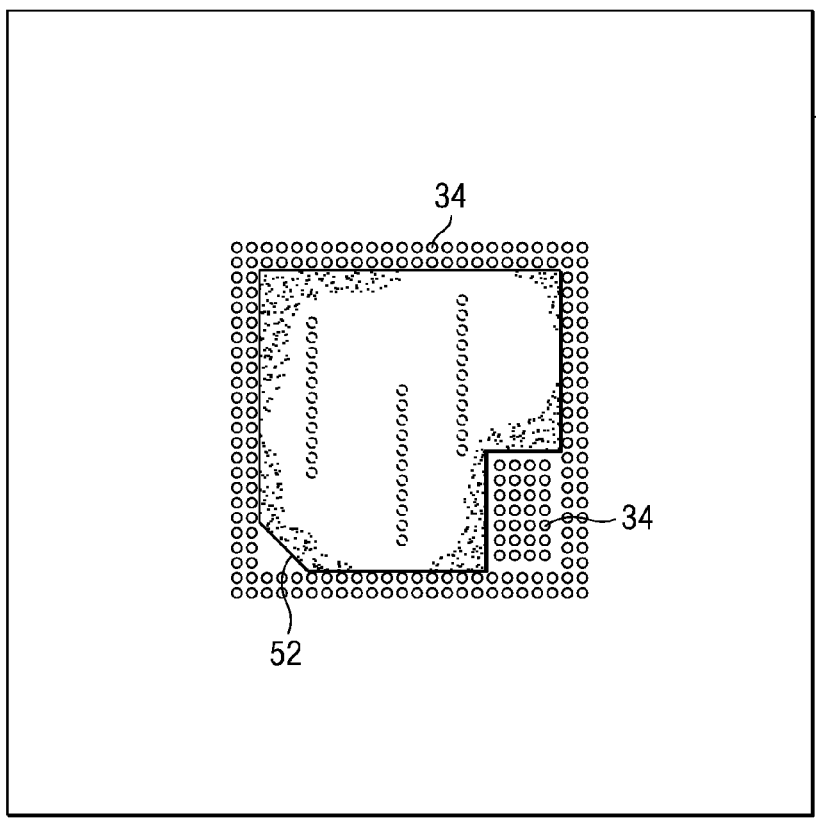
FIG. 10 shows a substrate of a fourth embodiment of the present invention.

The triangle-shaped patterns 52 and 58 shown in FIGS. 5 and 7 provide just one example shape among many possible shapes that may be used for an embodiment of the present invention. The shape possibilities for a pattern are endless. FIGS. 9 and 10 show substrates 24 patterned with a plasma treatment in accordance with third and fourth embodiments of the present invention, respectively. In FIG. 9, the patterned plasma-treated area 52 has a trapezoid shape, for example. In FIG. 10, the patterned plasma-treated area 52 is located in the central region where the solder bump density will be lower. Thus, the patterned plasma-treated area 52 may have any shape. Furthermore, there may be multiple patterns on each chip/substrate, and such patterns may or may not overlap, cross, or connect with each other. The pattern or shape of the plasma-treated area may be dictated by or designed based on the pattern of the solder bumps 26 and/or the density of the solder bumps 26, but not necessarily.

In accordance with a fifth embodiment (not shown) of the present invention, an entire surface of the substrate/chip is subjected to a first plasma treatment in addition to a patterned area (52/58) being subjected to a second plasma treatment. The first plasma treatment may be performed before or after the second patterned plasma treatment. In a fifth embodiment, the first plasma treatment may be of a different type with different plasma treatment parameters than the second plasma treatment. For example, the first plasma treatment may be designed to clean and activate the surface with little roughening, while the second plasma treatment is designed to roughen the surface to a greater degree.

In forming an embodiment of the present invention, the patterned plasma treatment may be performed on the existing surface of the chip 22 and/or the substrate 24, without the need for providing a special surface layer just for the plasma treatment. This will depend on the existing surface provided in a current design or layout for the chip/substrate. Hence, it is preferable that no additional layer needs to be added for allowing the patterned plasma treatment to be performed. For example, some manufacturers already provide a final nitride layer (e.g., cap nitride layer) at the surface and/or an organic overcoat layer, which may be amenable to the patterned plasma treatment. If a solder mask (not shown) is implemented on the substrate 24, it may be amenable to the patterned plasma treatment, for example. Alternatively, a layer may be added to the surface of the chip/substrate in anticipation of or specifically for performing a patterned plasma treatment in accordance with an embodiment of the present invention.

It will be appreciated by those skilled in the art having the benefit of this disclosure that embodiments the present invention provide patterned plasma treatment to improve the distribution of the underfill material. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A method of providing an underfill material between a chip and a substrate, comprising:

providing a chip mask having a pattern formed therein;

placing the chip mask over the chip;

performing a plasma treatment through the pattern formed in the chip mask onto a first side of the chip to form a plasma treated area on the first side of the chip, wherein the plasma treated area on the chip has a shape corresponding to the chip mask pattern, the treated area having a wide edge near the edge of the chip and a narrower edge near an opposite edge of the chip, and wherein the plasma treated area is smaller than the first side of the chip;

electrically connecting the chip to the substrate, wherein a gap remains between the chip and the substrate and wherein the first side of the chip faces the substrate; and dispensing the underfill material on the substrate at a location where the underfill material will be drawn into the gap by a capillary action.

2. The method of claim 1, further comprising:

providing a substrate mask having a pattern formed therein;

placing the substrate mask over the substrate; and performing a plasma treatment through the pattern formed in the substrate mask onto a first side of the substrate to form a plasma treated area on the first side of the substrate, wherein the plasma treated area on the substrate has a shape corresponding to the substrate mask pattern and wherein the plasma treated area on the substrate is in but not entirely covering a chip area where the chip will reside over the substrate when the chip is electrically connected to the substrate.

3. A method of providing an underfill material between a chip and a substrate, comprising:

providing a substrate mask having a pattern formed therein;

placing the substrate mask over the substrate;

performing a plasma treatment through the pattern formed in the substrate mask onto a first side of the substrate to form a plasma treated area on the first side of the substrate, wherein the plasma treated area on the substrate has a shape corresponding to the substrate mask pattern and wherein the plasma treated area on the substrate is in but not entirely covering a chip area where the chip will reside over the substrate when the chip is electrically connected to the substrate, and the treated area having a wide edge and an edge narrower than the wide edge opposite the wide edge and a straight edge joining the wide edge and the narrow edge;

electrically connecting the chip to the substrate, wherein a gap remains between the chip and the substrate and wherein the first side of the substrate faces the chip; and dispensing the underfill material on the substrate at a location where the underfill material will be drawn into the gap by a capillary action.

4. The method of claim 3, further comprising:

providing a chip mask having a pattern formed therein;

placing the chip mask over the chip;

performing a plasma treatment through the pattern formed in the chip mask onto a first side of the chip to form a plasma treated area on the first side of the chip, wherein the plasma treated area on the chip has a shape corresponding to the chip mask pattern and wherein the plasma treated area is smaller than the first side of the chip.

* * * * *